(12) United States Patent
Simon et al.

(10) Patent No.: US 7,475,784 B2
(45) Date of Patent: Jan. 13, 2009

(54) DEVICE FOR DETECTING THE REMOVAL OF A PRODUCT FROM A PACKING SYSTEM BY AN ELECTRONIC UNIT

(76) Inventors: Udo Simon, Virchowstrasse 16, Nuernberg (DE) 90409; Ernst-Rudolf Radtke, Gablonzer Strasse 6, Lauf a. d. Peg. (DE) 91207

( * ) Notice: Subject to any disclaimer, the term of this patent is extended or adjusted under 35 U.S.C. 154(b) by 796 days.

(21) Appl. No.: 10/503,595

(22) PCT Filed: Jan. 23, 2003

(86) PCT No.: PCT/DE03/00180

§ 371 (c)(1),
(2), (4) Date: Nov. 15, 2004

(87) PCT Pub. No.: WO03/068138

PCT Pub. Date: Aug. 21, 2003

(65) Prior Publication Data

US 2005/0063102 A1 Mar. 24, 2005

(30) Foreign Application Priority Data

Feb. 14, 2002 (DE) ................................ 102 06 138
Mar. 26, 2002 (DE) ................................ 102 13 594

(51) Int. Cl.
*B65D 83/04* (2006.01)
(52) U.S. Cl. ....................... 206/534; 206/531; 206/528; 368/10
(58) Field of Classification Search ................. 206/528, 206/534, 531, 538; 368/10, 107, 109, 89; 116/308

See application file for complete search history.

(56) References Cited

U.S. PATENT DOCUMENTS

| 4,125,190 A | 11/1978 | Davie, Jr. et al. | |
|---|---|---|---|
| 4,526,474 A | 7/1985 | Simon | |
| 4,617,557 A * | 10/1986 | Gordon | .................... 340/309.7 |
| 4,660,991 A | 4/1987 | Simon | |
| 5,181,189 A * | 1/1993 | Hafner | ......................... 368/10 |
| 5,871,831 A * | 2/1999 | Zeiter et al. | .................... 428/76 |
| 6,006,913 A | 12/1999 | Lüdemann et al. | |
| 6,574,166 B2 * | 6/2003 | Niemiec | ....................... 368/10 |

FOREIGN PATENT DOCUMENTS

WO 96/04881 2/1996

* cited by examiner

*Primary Examiner*—David T Fidei
(74) *Attorney, Agent, or Firm*—Jacobson Holman PLLC (57) ABSTRACT

A device for detecting the removal of a product from a packing system by an electronic unit. The products are arranged in individual bags which are sealed by a sealing film that can be perforated so as to remove a product from a bag. The device has a combination of layers including at least one supporting plate and a coating layer which is applied thereto. The combination of layers is connected to the packing system in such a way that the coating layer faces the sealing film. The coating layer is provided with individual strip conductors, each of which runs across an area that is assigned to a bag and is electrically interrupted when a product is removed from the respective bag. The supporting plate includes openings, each of which is assigned to a bag. A product which is removed from a bag is guided through the respective opening.

18 Claims, 11 Drawing Sheets

Figur 2

Figur 1

Figur 3

Figur 4

Figur 4a

Figur 4b

Figur 5

Figur 7b

Figur 7a

Figur 8a

Figur 8

Figur 10b

Figur 10a

Figur 10

Figur 11a

Figur 11d

Figur 12

Figur 11b

Figur 11c

DEVICE FOR DETECTING THE REMOVAL OF A PRODUCT FROM A PACKING SYSTEM BY AN ELECTRONIC UNIT

BACKGROUND OF THE INVENTION

1. Field of the Invention

This is a nationalization of PCT/DE03/00180 filed Jan. 23, 2003 and published in German.

The current invention concerns a device for recording the removal of a product from a packaging arrangement by means of an electronic device where the products are arranged in individual packets sealed off by a sealing foil that is perforable for removal of a product.

2. Description of the Related Art

Blister packet arrangements are known in which are arranged, on the surface of the sealing foil, conductive tracks, which run over the pocket zones of the blister packet arrangement and which are interrupted upon removal of a medication from a pocket. The blister packet arrangement is connectable to an electronic unit, which detects such interruptions for recording the removal of the medication and stores them to memory.

One problem consists therein that the blister packets must be imprinted with conductive tracks during their production, thus requiring elaborate and costly processing steps and production systems. For this reason, such blister packet arrangements are not particularly well suited for implementing pilot projects, in which blister packets are produced in only relatively small numbers of units for limited use.

SUMMARY OF THE INVENTION

Therefore, the task of the current invention consists in creating a device, by which the removal of the product from a packaging arrangement can be recorded in an extremely simple and secure manner.

This task is resolved by a device for recording the removal of a product from a packaging arrangement by means of an electronic unit in which the products are arranged in individual pockets sealed off by a sealing foil that is perforable for the removal of a product from a pocket. The device exhibits the form of a composite layering, comprised of at least one carrier plate and of a cover layer applied thereupon. The composite layering is unitable with the packaging arrangement in such a manner that the cover layer of the sealing foil faces the packaging arrangement, that the cover layer exhibits individual conductive tracks, of which respectively one runs over the zone respectively ascribed to one pocket of the packaging arrangement and, upon removal of a product from the corresponding pocket of the packaging arrangement, the individual conductive track is electrically interruptible. In addition, the carrier plate exhibits openings, of which respectively one is ascribed to a pocket of the packaging arrangement, whereby respectively one product taken out of a pocket of the packaging arrangement can be guided through the corresponding opening of the carrier plate.

A special advantage of the current invention consists in that the present device is designed as a composite layering, which is comprised of a cover layer supporting the conductive tracks and of a carrier plate, in which openings are provided for letting the products pass through, out of a packaging arrangement, bound with the composite layering. Based on the requirements, this composite layering is bindable to packaging arrangements that properly match up.

Another special advantage of the current invention consists therein that the present device can be designed in such a manner that removal of the product by small children can be safely avoided. To this end, the carrier plate exhibits a safety layer on its face opposite the packaging arrangement. Prior to removing the product from the packaging arrangement bound to the device, a peel back section, protecting the corresponding opening of the carrier plate, must be detached from the safety layer and pulled off. Only after having pulled off the peel back section, can the corresponding product be expressed out through the corresponding opening of the carrier plate. The conductive track of the safety layer ascribed to the pocket of the packaging arrangement is thereby irreversibly severed and an electronic unit recognizes the change in status of the packaging arrangement connected to the device. The electronic unit is thereby located in a holding device into which the packaging arrangement connected to the present device is inserted.

Another essential advantage of the current invention consists therein that upon insertion of the device connected to the packaging arrangement into the holding device, it is ensured that the carrier plate automatically lands in the proper plug connection position so that the conductive tracks are properly connected to the electronic unit.

An asymmetrical arrangement of the guiding elements, preferably of punched-in elements, allows for only one distinct positioning of the device connected with the packaging arrangement into the holding device.

Erroneous interceptions of signals due to faulty insertion of the device connected to the packaging arrangement into the holding device can be advantageously and securely avoided. This is achieved in that the electronic unit will only then be activated, when the device is located into the proper plug contact position. Owing to this, problems can be avoided that are attributable to the operations involved in inserting the device into the holding device. Such operations could lead to contact interruptions, thus simulating the removal of a product, as after having established one individual electrical connection between the device and the electronic unit, while relative movements are being exerted between the device and the holding device during insertion.

Coding on the carrier plate by means of punched-in elements, holes, slits, bar codes or electronic processes etc. makes it possible for the electronic unit to recognize which product is lodged in the packaging arrangement connected to the device. This coding is possible, for example, by punching in slits into the carrier plate, which interrupts the closed contacts to the electronic unit, or can be realized by imprinting on to the carrier plate conductive contact spots/lands whose varying configuration can be assigned to a corresponding product contained in the packaging arrangement.

In order to produce a bond between the device and the packaging arrangement that is durable, the edge zones of the packaging arrangement and/or of the device are preferably bound by a surrounding adhesive. In this manner, a largely durable bond has been ensured between the packaging arrangement and the conductive track carrying, perforable cover layer and the carrier plate of the present device.

An economically sensible production and the positionally oriented matchup of the packaging arrangement with the device are advantageously ensured. This is resolved in accordance with the invention in that on the cover foil of the packaging arrangement, one or several registration marks are imprinted, which, for example, can be read by an optical control unit or through one or several windows of the device. This type of production is carried out in the industry under the concept of "roll on roll production". That is to say, that on the packaging arrangements filled with products and sealed off with a sealing foil, the devices in accordance with the invention, coming from a roll, are led to a machine, which places the devices into positional orientation, that is, exactly on registration mark on top of the packaging arrangements and respectively binds the packaging arrangements and the devices in a durable manner, preferably, by an adhering/ sealing process. A subsequent punching process punches in the final form desired for the packaging arrangements.

But it is also possible to unite the device with a packaging arrangement, which was punched out beforehand, in such a manner that the union is durably registration-mark precise. To this end, the packaging arrangement is laid in a pickup attachment, which receives the pockets and/or a pleat in the packaging arrangement. The device is placed on to the plane lying underside of the packaging arrangement, thus, on to the sealing foil of the packaging arrangement. Hereby, locating orientation is also achieved through the registration marks, which are electronically read or controlled, and/or through the means of auxiliary mechanical guides.

The contact spots/lands of the severable, conductive track supporting cover layer and the contact spots/lands of the carrier plate are purposefully durably connected by a conductive adhesive.

This is advantageous in that this durable bonding ensures a secure contact between the contact spots of the cover layer and of the carrier plate.

BRIEF DESCRIPTION OF THE DRAWINGS

The inventions and their forms of embodiment shall be more closely detailed in the following with the aid of the figures. Are shown in.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The following considerations led to the invention. In order to avoid high production costs attributable to the imprinting of conductive tracks on to the packaging arrangements, specifically during pilot phase development of and testing on the packaging arrangements, in which electronic monitoring of product removal is carried out, in particular on blister packets, we propose a device comprised of several layers produced separately from the packaging arrangements and then to subsequently unite said device to said packaging arrangements. In this manner, the costs incurred on the production side of packaging arrangements on the one hand are reduced and the separately produced devices for the secure recording of product removal can be separately produced and depending on the requirements, can then be united with the packaging arrangements. The devices are individually tailored to the packaging arrangements.

Figure 4:
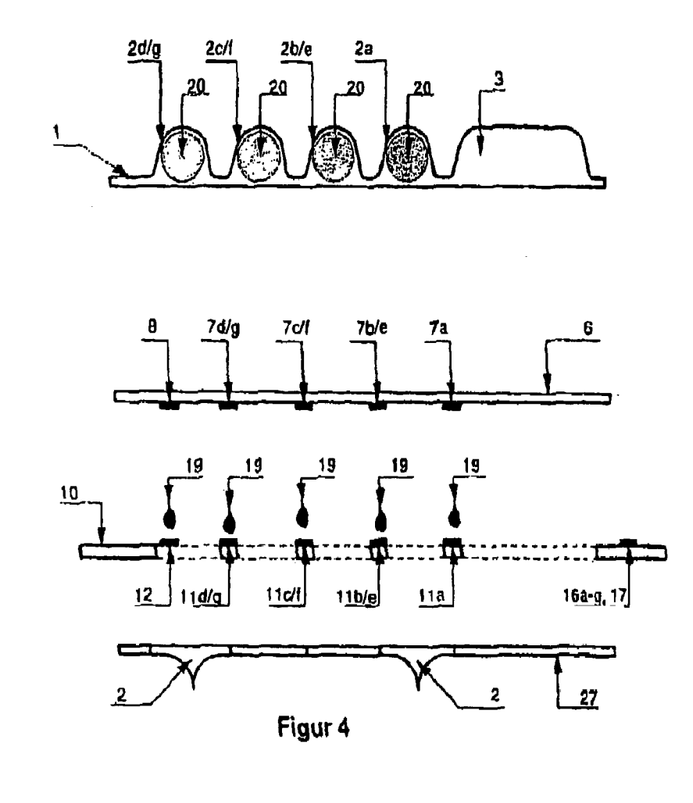
FIG. 4, a section through the packaging arrangement and the various layers of the device in accordance with the invention, wherein beneath the packaging arrangement is represented the cover layer with the conductive tracks, which are affixed to the carrier plate by means of a conductive adhesive, whereby for small child safety, a safety layer can be applied on the underside of the carrier plate, whose detachable pull off zones cover the openings of the carrier plate.
Figure 4A:
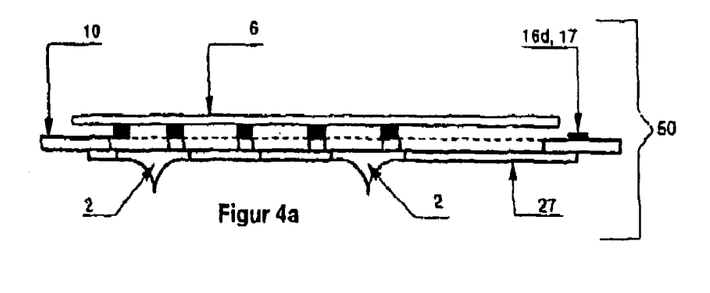
FIG. 4*a*, the individual layers of the composite layering of the device in accordance with the invention in a united state.
Figure 4B:
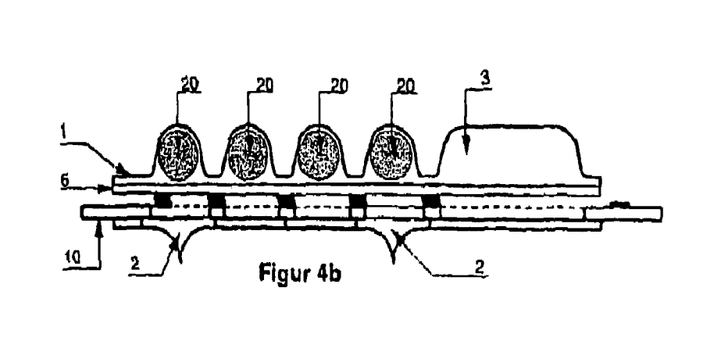
FIG. 4*b*, the individual layers of the composite layering of the device in accordance with the invention and the packaging arrangement united with said device.

The present device is essentially comprised of a composite layering 50, seen in FIG. 4*a*, which is united with a packaging arrangement 1 in accordance with FIG. 4*b*.

The packaging arrangement 1 hereby exhibits, in the standard manner, several pockets 2*a* through 2*g* for receiving, e.g., medications, in particular tablets, electronic components, sweets or other products 20.

For example, the packaging arrangement 1 exhibits two rows of pockets, arranged running side by side, each said row with respectively three pockets 2*b*, 2*c*, 2*d* or 2*e*, 2*f*, 2*g*, and one additional pocket 2*a*, arranged at the center of the one end of the rows facing on another. To the side of the center pocket 2*a*, opposite the two pocket rows, a larger pocket shaped compartment 3 can be arranged, into which a folded information sheet or such similar sheet can be provided. Other arrangements or patterns of pockets are possible.

The composite layering 50 is comprised of a carrier layer or a carrier plate 10, which is preferably composed of a specifically flexible plastic material, preferably of PVC, and is comprised of a cover layer 6 provided with individual conductive tracks 7*a*' through 7*g*', said cover layer being arranged on the one side of the carrier plate 10 in such a manner that the individual conductive tracks 7*a*' through 7*g*' are arranged on the side opposite from the carrier plate 10 and on the side facing the packaging arrangement 1 to be secured. Possibly, a safety layer 27 is arranged on the side of the carrier plate 10 lying opposite the cover layer 6, which shall be more closely detailed later.

Figure 2:
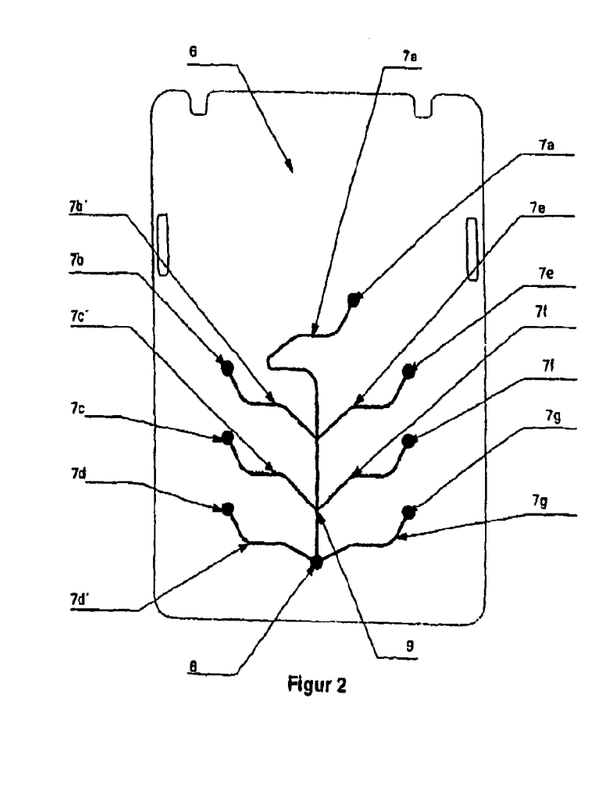
FIG. 2, the cover layer with the conductive tracks of the present invention, seen from below.

In accordance with FIG. 2, various individual contact spots 7*a* through 7*g* are arranged on the cover layer 6, wherein each contact spot is assigned respectively one punched hole or opening 13*a* and 13*g* on the carrier plate 10 and is arranged in proximity of said hole or opening.

From each individual contact spot 7*a* through 7*g* runs an individual conductive track 7*a*' through 7*g*' on the cover layer 6, via a corresponding opening 13*a* through 13*g* through the carrier plate 10 located beneath it, to a common conductive track 9 on the cover layer 6, running centrally preferably between the two rows of openings of the carrier plate 10, said common conductive track being connected to a common contact spot 8 of the cover layer 6.

By means of this arrangement, it is ensured that outgoing from the common contact spot 8 of the cover layer 6, an electrical connection is established via one respective conductive track 7a' through 7g' running through an opening 13a through 13g to the individual contact spot 7a through 7g assigned to the respective opening 13a through 13g.

The packaging arrangement 1 is placed upon the composite layering 50 in such a manner that the areas of the pockets 2a through 2g, to be expressed out, are aligned with the openings 13a through 13g of the carrier plate 10. In the case of product removal from a pocket 2a through 2g, the electrical connection, assigned to the pocket or opening, between the common contact spot 8 and the respective individual contact spot 7a through 7g, is interrupted.

Figure 1:
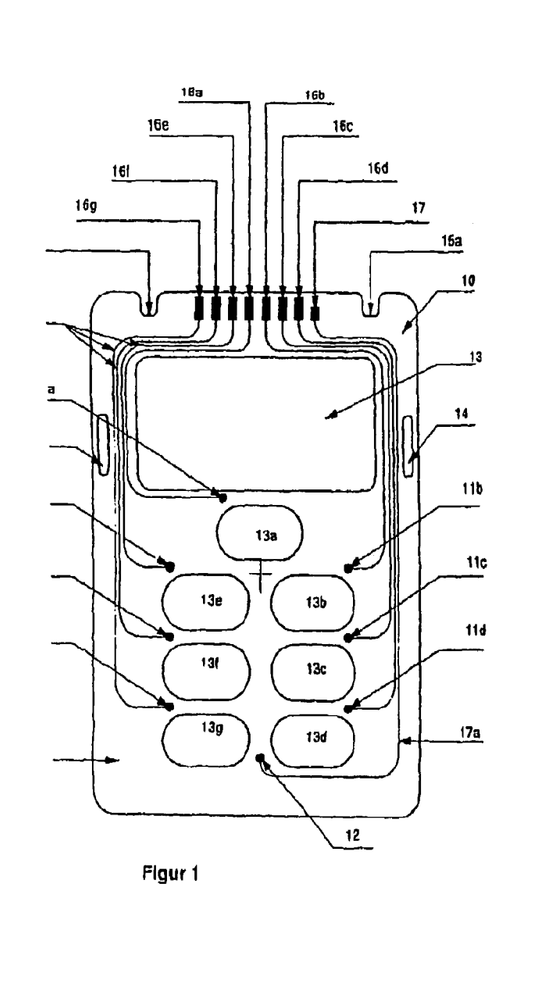
FIG. 1, the carrier plate of the present device seen from above, with the openings, which are aligned to match up with the pockets of the packaging arrangements to be positioned, as well as with the common terminal contact points and the individual contact points.
Figure 3:
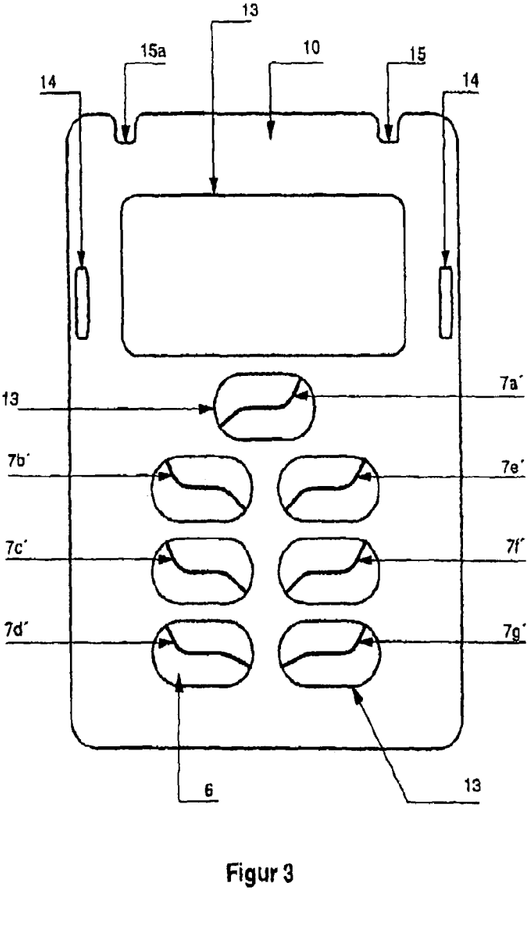
FIG. 3, the carrier plate, seen from below with a partial view over the cover layer and of its individual conductive tracks through the openings of the carrier plate.

Assigned to the cover layer 6 that is designed in such a manner is the previously mentioned carrier plate 10, which can be seen in FIGS. 1 through 3. Depending on the configured pattern of the contact spots 7a through 7g and 8 of the cover layer 6, the carrier plate 10 exhibits, on its one face, a pattern of individual contact spots 11a through 11g and of one common contact spot 12, wherein the contact spots 11a through 11g have the same registration orientation as the individual contact spots 7a through 7g of the cover layer 6 and the common contact spot 12 has the same registration orientation as the common contact spot 8 of the cover layer 6, when the underside of the cover layer 6 is laid upon the surface of the carrier plate 10 exhibiting the contact spots 11a through 11g and 12.

Depending on the configured pattern of the pockets 2a through 2g and of the compartment 3 of the packaging arrangement 1, the carrier plate 10 exhibits openings 13a through 13g corresponding to the pockets 2a through 2g and an opening 13 corresponding to the compartment 3, said openings being alignable with pockets 2a through 2g or with compartment 3.

The composite layering 50 is preferably dimensioned such that the carrier plate 10 projects beyond the packaging arrangement 1 on all sides when it has been united with the packaging arrangement 1 which shall be detailed later.

FIGS. 4, 4a and 4b show a section representing how the cover layer 6 is secured to the carrier plate 10, wherein the individual contact spots 7a through 7g of the cover layer 6 (compare to FIG. 2) are then electrically connected to the corresponding individual contact spots 11a through 11g (compare to FIGS. 4, 4a) of the carrier plate 10, and the common contact spot 8 of the packaging arrangement 1 is electrically connected to the common contact spot 12 of the carrier plate 10. FIG. 4b shows a section representing the state in which the packaging arrangement 1 is united with the composite layering 50 of the current device. It is hereby of utmost importance that the compartment 3 and the pockets 2a through 2g of the packaging arrangement 1 are aligned with the openings 13, 13a through 13g of the carrier plate 10.

This is achieved in FIG. 4 in that the carrier plate 10 and the cover layer 6 are mutually oriented to line up together and are pressed to one another, according to the configuration of preferably adhesive registration points 19 on the contact spots 11a through 11g and 12 of the carrier plate 10 of the composite layering 50 and/or on the contact spots 7a through 7g and 8 of the cover layer 6. After this and once the adhesive of the registration points 19 has hardened, electrical connections are established between the mutually assigned contact spots 7a through 7g and 8 of the cover layer 6 and the contact spots 11a through 11g and 12 of the carrier plate 10.

As shown in FIG. 1, off to the one side, preferably on the front end of the carrier plate 10, are located individual terminal contact points 16a through 16g and a common terminal contact point 17, preferably in a row, next to one another. Each individual terminal contact point 16a through 16g is connected to a specific contact spot 11a through 11g of the carrier plate 10 via an individual conductive track 16. The common terminal contact point 17 is connected to the common contact spot 12 of the carrier plate 10 via a common conductive track 17a.

In this manner, electrical connections are established in the finished product of the composite layering 50 of the current device as per FIGS. 4a and 4b, said electrical connections being between each individual terminal contact point 16a through 16g, via the individual conductive tracks 16 (compare to FIG. 1), to the individual contact spots 11a through 11g of the carrier plate 1, and via the adhesive registration points 19, to the individual contact spots 7a through 7g of the safety layer 6. This also generally applies to the common contact spots 17, 12, 8.

Figure 6:
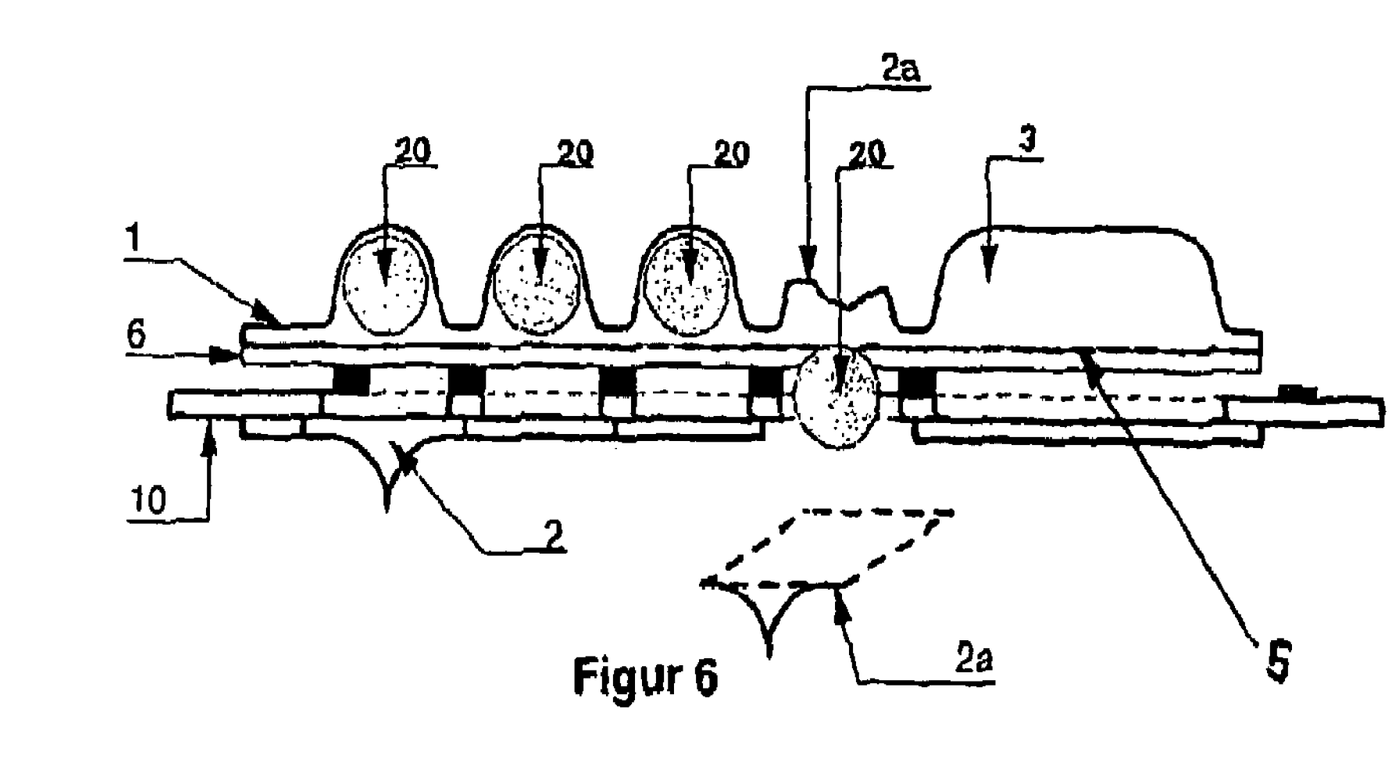
FIG. 6, a representation for explaining the mode of operation of the current device, wherein a product was expressed out of the packaging arrangement, after a pull off zone of the safety layer had been previously removed, said safety layer serving for small child safety.

Upon removal of the product 20 from the packaging arrangement 1, or for example, upon removal of the product 20 from the pocket 2a in FIG. 6, by expression of the product 20 out of the packaging arrangement 1, the sealing foil 5 of the packaging arrangement 1 as well as the individual conductive track 7a of the cover layer 6 are broken through, so that the corresponding electrical connection is interrupted, thus indicating the specific removal of the product. All other electrical connections remain unchanged during this operation.

Figure 7A:
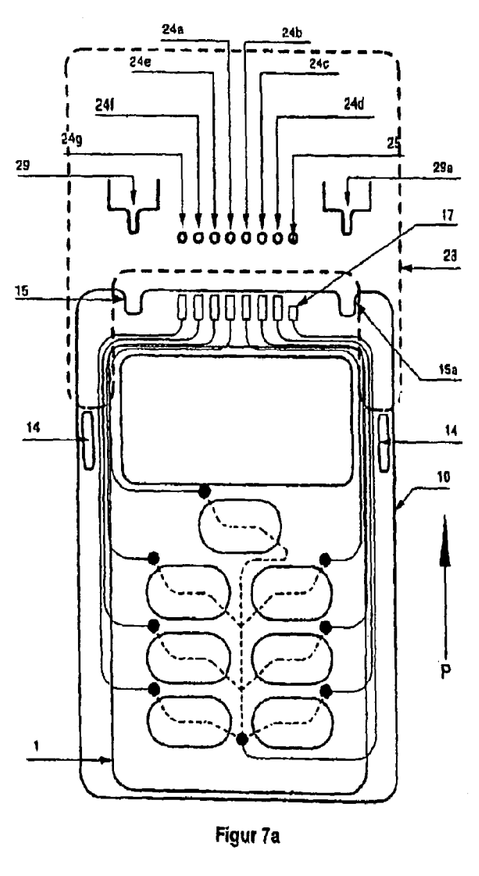
FIG. 7*a*, the packaging arrangement bound to the present device prior to insertion into the holding device.
Figure 7B:
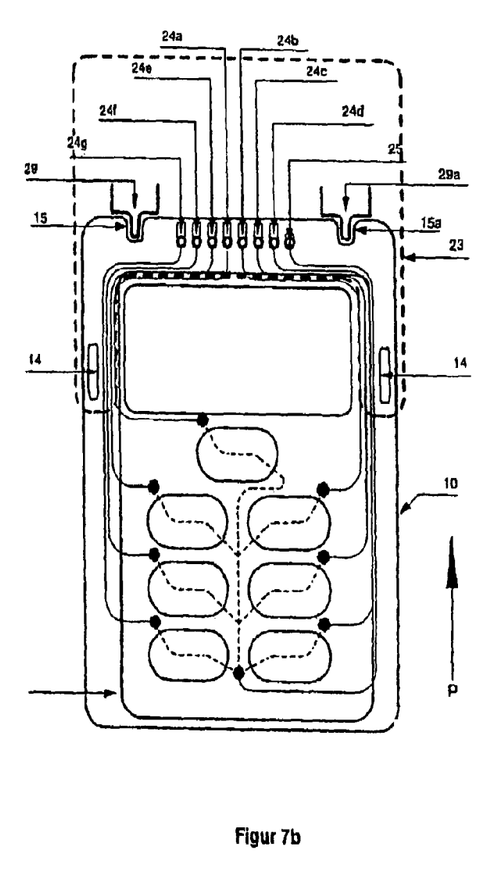
FIG. 7*b*, the packaging arrangement bound to the present device after insertion into the holding device.
Figure 8:
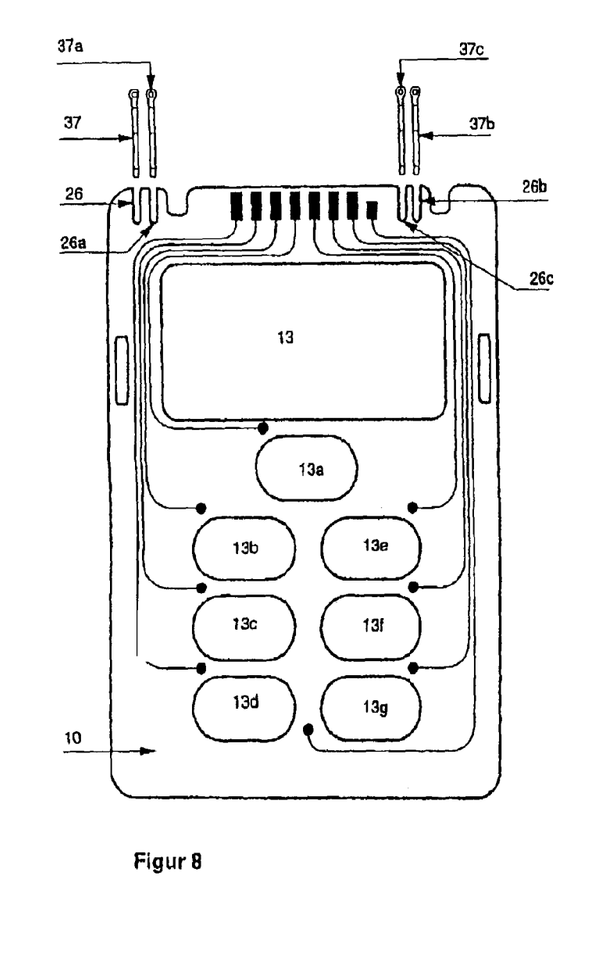
FIGS. 8-12, further embodiments of the invention.
Figure 8A:
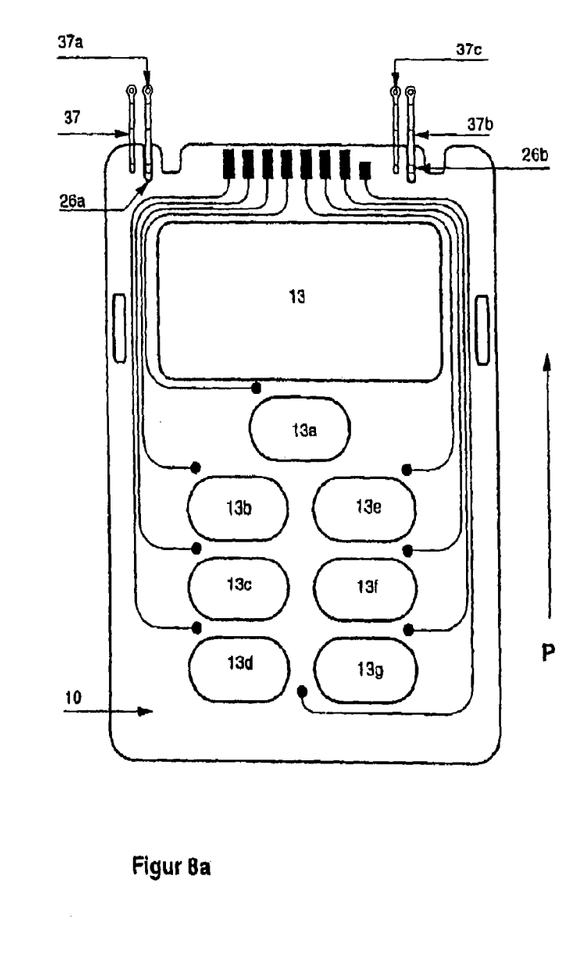

In accordance with FIGS. 7a, 7b, the current composite layering 50 is inserted into a schematically represented receiving part 23 of a holding device, which does not figure in a more detailed representation, whereby the electronic unit or an electronic module (not represented) contained in the receiving part 23 is connected, via the individual terminal contact points 24a through 24g and the common terminal contact point 25, to the terminal contact points 16a through 16g and 17 (compare to FIG. 4) of the composite layering 50.

In order to prevent the initial establishment of current flowing between the common terminal contact point 25 of the receiving part 23 and an individual terminal contact point 24a through 24g of the receiving part 23 during insertion, and to avoid being interrupted again, upon subsequent insertion of the packaging arrangement 50 into the receiving part 23, which would be falsely interpreted by the electronic unit as meaning that a product was removed, the common terminal contact point 17 of the carrier plate 10 (compare to FIG. 7) in the insertion pack P is dimensioned to be shorter than the individual terminal contact points 16a through 16g of the carrier plate 10, so that contact is made between the common terminal contact point 17 of the carrier plate 10 and the common contact spot 25 of the receiving part 23 assigned to it, only then after secure contact has been made between the individual terminal contact points 16a through 16g of the carrier plate and the assigned individual terminal contact points 24a through 24g of the receiving part 23.

In order to ensure adjustment and alignment of the present device united with the packaging arrangement 1 transverse to the insertion pack P in terms of the receiving part 23, the carrier plate 10, on its front end, on the face with its terminal contact point rows 16a through 16g, 17, exhibits an alignment slot 15 or 15a, wherein these alignment slots 15 and 15a are asymmetrically arranged relative to the longitudinal center line of the carrier plate 10 (compare, for example, to FIG. 7a, 7b). In the receiving part 23 are arranged corresponding nose tabs 29 or 29a (schematically represented in FIGS. 7a, 7b), which catch in the alignment slots 15 and 15a when the carrier plate 10 is properly positioned in the receiving part 23. Only then can the electrical connections be established between the terminal contact points 16a through 16g and 17 and 24a through 24g and 25.

We would also like to point out that conversely, the nose tabs can be arranged on the packaging arrangement 1 and the alignment slots can be arranged on the receiving part 23.

It is also conceivable to design the terminal contact point 17 to correspond with the individual terminal contact points 16a through 16g, and instead of that, to design the common terminal contact point 25 in the receiving part 23 shorter, in the direction of insertion P, than the individual contact spots in the receiving part 23, so that upon inserting the carrier plate 10 into the receiving part 23 in the direction of insertion P, the contact between the common terminal contact point 25 of the receiving part 23 and the common terminal contact point 17 of the carrier plate 10 is established later than the contacts between the individual terminal contact points 24a through 24g of the receiving part 23 and the individual terminal contact points 16a through 16g of the carrier plate 10.

Figure 5:
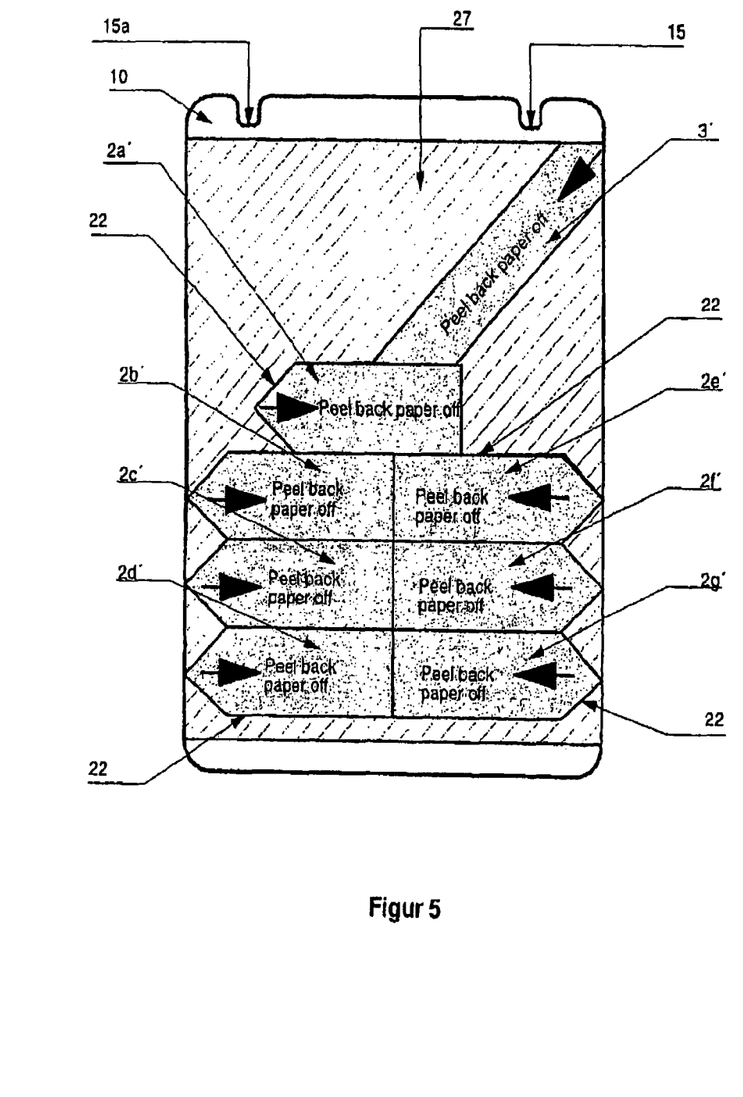
FIG. 5, the carrier plate dressed with the safety layer, wherein the peelable pull-off zones are visible.

In the following, another essential feature of the current invention is explained:

On the underside of the carrier plate 10, and in the manner shown in FIG. 5, an additional safety layer 27 is applied, preferably consisting of material similar to paper, which exhibits a peel back zone 3' or 2a' through 2g', ascribed to each individual opening 13, 13a through 13g or ascribed to the carrier plate 10, said peel back zone covering the edge area of the corresponding opening. When using the packaging arrangement 1, prior to expressing a product 20 out or prior to opening the compartment 3, the corresponding peel back zone 3 must be pulled off.

The peel back zones 2a' through 2g' and 3' are detachably affixed by pressure application of a detachable adhesive bonding compound to the underside of the carrier plate 10 and detachably affixed to the cover layer 27 over punched-in lines 22.

This permits preventing small children (as a rule, up to the age of 42 months) from removing products from the packaging arrangement due to their inherent drive of playing with everything, since, as a rule, such children are usually not capable of carrying out two different operations, namely of pulling off the peel back zone and after that, of expressing the product out.

In accordance with FIG. 1, it is conceivable to provide slits 14, running in the longitudinal edges of the carrier plate 10 in the insertion pack P, which catch in corresponding (not represented) projections of the receiving part 23 or of the holding device, when the carrier plate 10 reaches the proper position in the receiving part 23. In this manner, a secured stop ensures that the packaging arrangement 1 in the receiving part 23 is not unintentionally pulled out. These slits 14 are also especially useful when the composite layering 50 is to be placed upon an individual packaging arrangement 1 in the proper positional orientation.

Figure 11A:
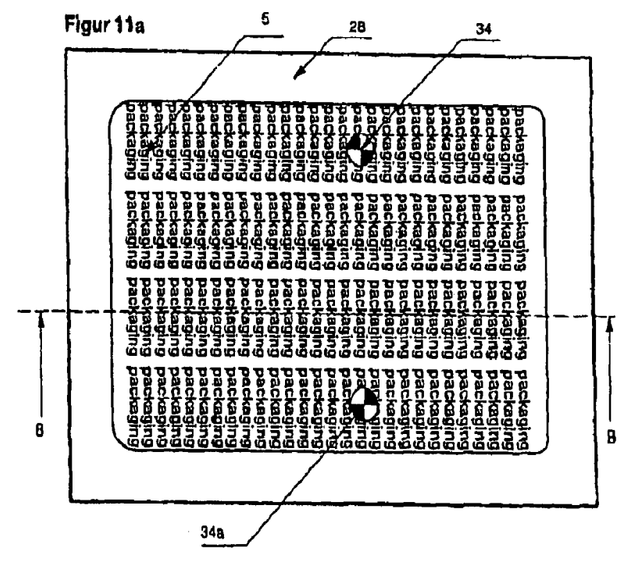
Figure 11B:
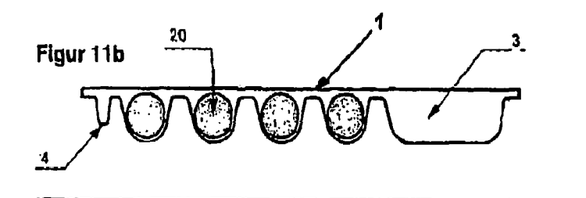
Figure 11C:
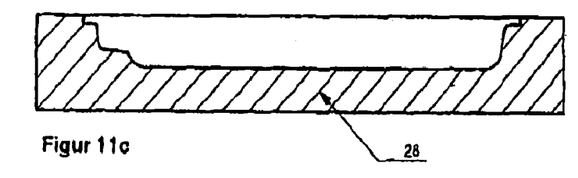
Figure 11D:
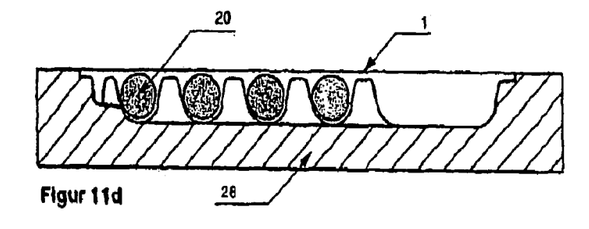
Figure 12:
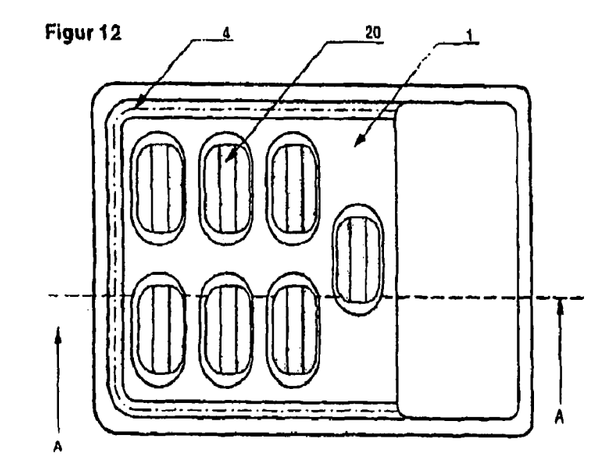
Figure 12A:
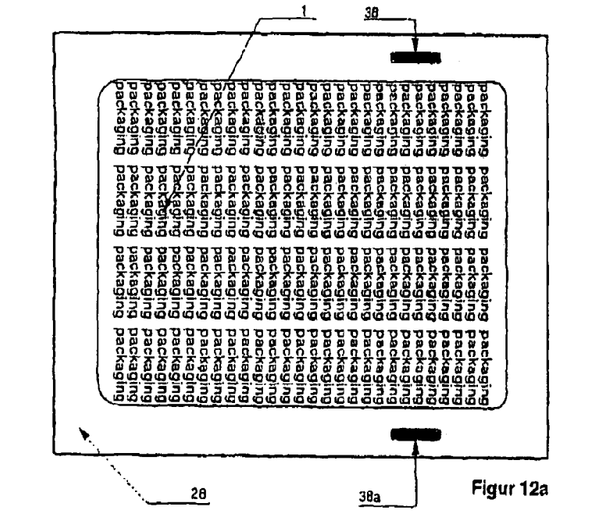
Figures 12B, 12C:
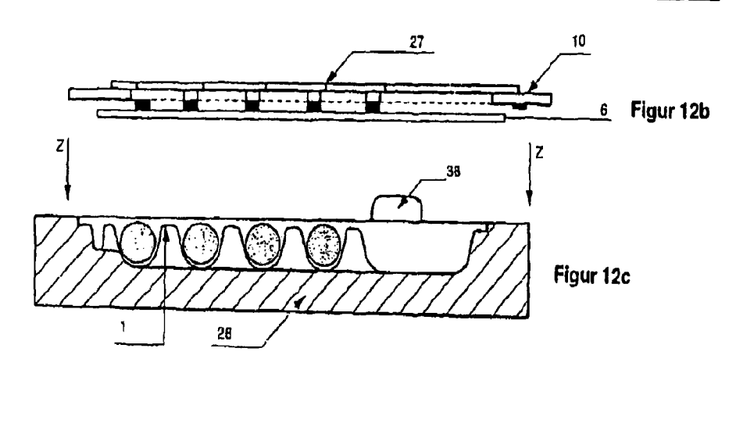
Figure 12D:
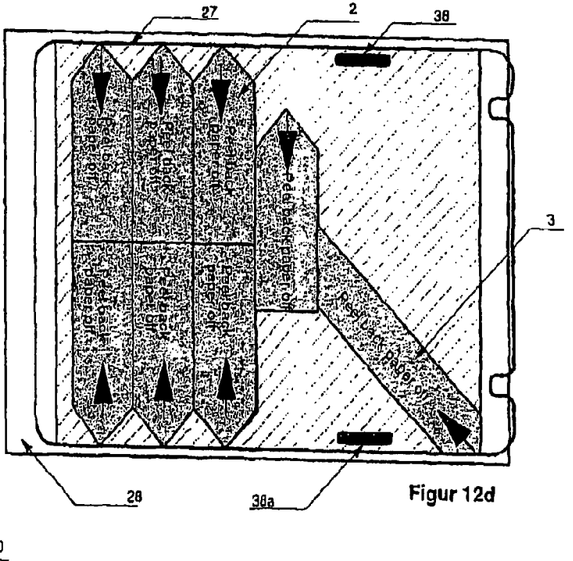

FIG. 11c shows a pickup attachment 28, which is receiving the packaging arrangement 1. The internal form of the pickup attachment 28 corresponds to the form of the packaging arrangement 1. In accordance with FIGS. 11a (top view) and 11d (section), a packaging arrangement is laid into the pickup attachment 28. The composite layering 50, comprised of a cover layer 6, a carrier plate 10 and a safety layer 27, can now be united with the packaging arrangement 10 in proper form and manner. For the exact proper positioning of the openings 13, 13a through 13g, the packaging arrangement 1 is laid down with the slots 14 of the carrier plate 10 on auxiliary guides 38, 38a of the pickup attachment 28 (compare to FIGS. 12a, 12c, 12d). This allows the pockets 2a through 2g of the packaging arrangement 1 to align themselves with the openings 13, 13a through 13g of the carrier plate 10 of the composite layer 50.

To make it possible to indicate the contents of the respective packaging arrangement, the carrier plate 10 can exhibit the previously mentioned types of coding, which can be read by the electronic unit. A preferred form of embodiment emerges from FIGS. 8, 8a, 9, 9a and 9b.

Figure 9:
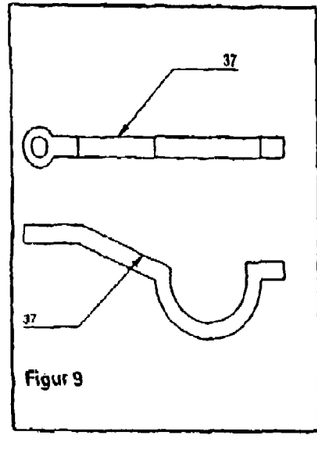
Figure 9A:
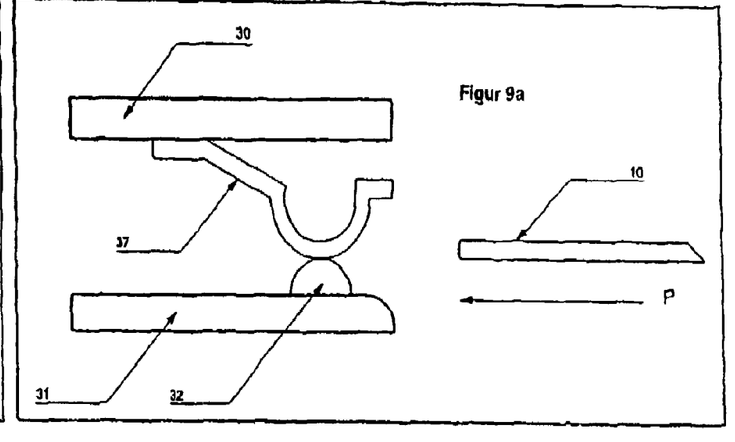
Figure 9B:
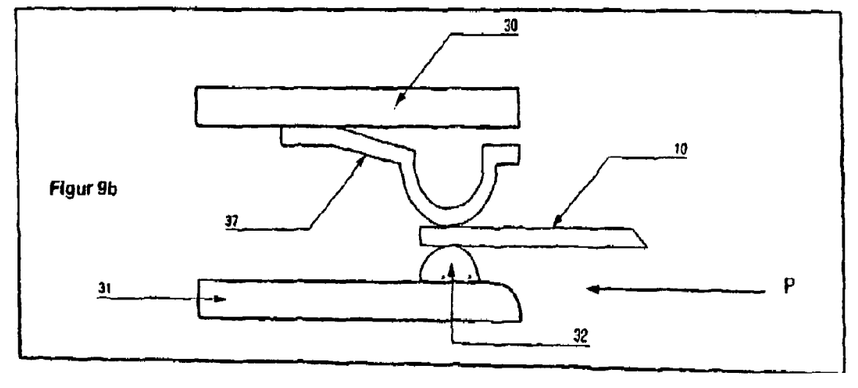

In the carrier plate 10 of the composite layering 50, on the front end to be inserted into the receiving part 23, are arranged coding slots 26, 26a through 26c, which work together with contact springs 37, 37a through 37c, which are purposefully arranged in the receiving part 23 in the insertion pack P. FIG. 9 shows such a contact spring 37 from above and from the side. In the receiving part 23 are contact springs 37, as seen in FIGS. 9a and 9b, secured to an upper printed circuit board 30 in such a manner that its contacting areas rest against a contact spot 32 of a lower printed circuit board 31 set opposite the upper printed circuit board 30.

Depending on whether the contact springs 37, 37a-c hit or do not hit upon a coding slot 26, 26a through 26c when the carrier plate 10 is inserted into the insertion pack P, the contact between the contact spring and the contact spot will be interrupted or not interrupted. In this manner, for example when there are four contact springs, depending on the predetermined arrangement of the coding slots or the absence of coding slots, various statements can be made as to the contents or the type of packaging arrangement 1 and can be recorded or displayed by the electronic unit.

Figure 10:
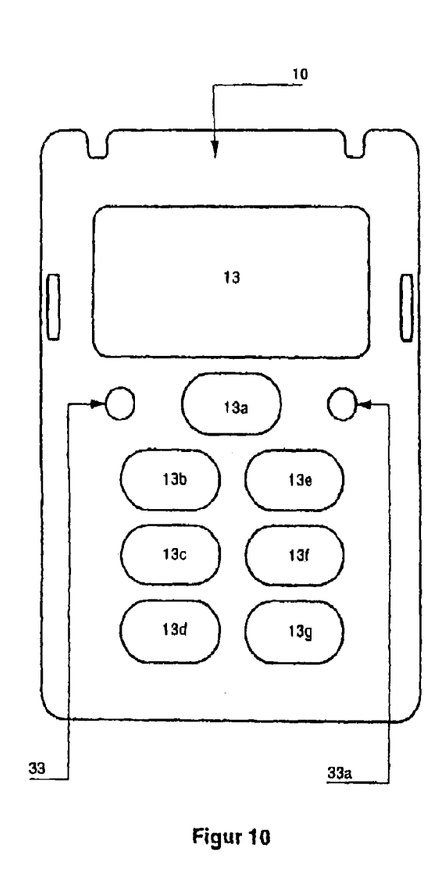
Figure 10A:
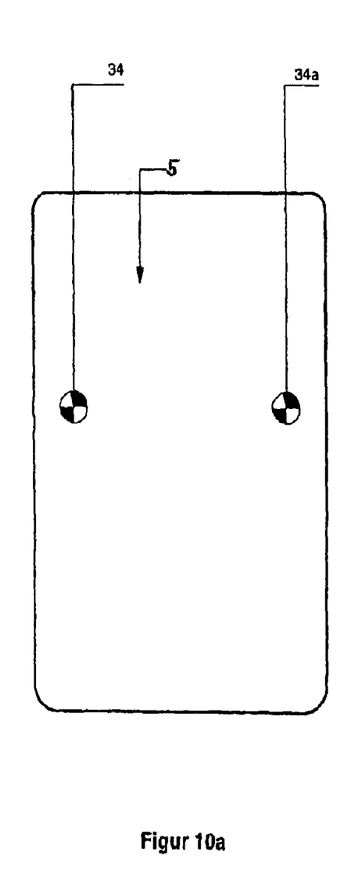
Figure 10B:
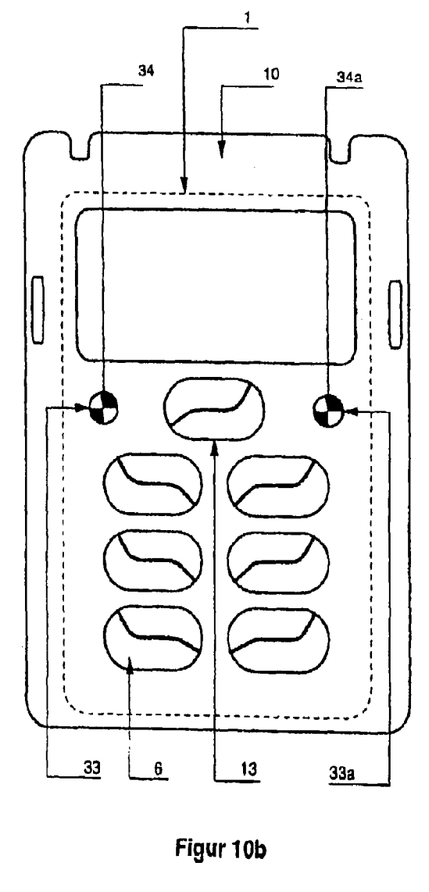

In relation to FIGS. 10, 10a and 10b, a preferred process for applying the present device on top of the sealing foil 5 of the packaging arrangement 1 shall now be described. To this end, the composite layering 50 exhibits windows 33, 33a arranged in its layers, which, when in proper set position, are aligned with registration marks 34, 34a, which are applied to the sealing foil 5 of the packaging arrangement 1. After, for example, the edge areas 1 of the packaging arrangements 1 have been provided with adhesive registration points 19, the individual packaging arrangements 1 are conveyed in their longitudinal direction, positioned one behind the other in path formation, whereby approaching from above are also devices positioned one behind the other in path formation, and finally are conveyed parallel to the packaging arrangements 1, until, preferably, an optical sensor recognizes that the windows 33, 33a of a composite layering 50 are aligned with the registration marks 34, 34a of a packaging arrangement 1. As soon as this occurs, the composite layering 50 is pressed against the packaging arrangement 1 and is united with the sealing foil 5 of the latter, in particular is adhered therewith.

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

The invention claimed is:

1. A device for recording the removal of a product from a packaging arrangement using an electronic unit, in which products are arranged in individual pockets sealed off by a sealing foil that is perforable for the removal of a product from a pocket said device comprising a composite layering, having at least one carrier plate and a cover layer applied thereupon, said composite layering being unitable with the packaging arrangement in such a manner that the cover layer of the sealing foil faces the packaging arrangement, said cover layer including individual conductive tracks, of which respectively one track runs over a zone respectively ascribed to one pocket of the packaging arrangement and upon removal of a product from the corresponding pocket of the packaging arrangement said individual conductive track being electrically interruptible, said carrier plate having openings, of which respectively one opening is ascribed to a pocket of the packaging arrangement, such that respectively one product taken out of a pocket of the packaging arrangement is guided through the corresponding opening of the carrier plate.

2. The device in accordance with claim 1, wherein each individual conductive track of the cover layer runs, starting from an individual contact spot of the cover layer over the area of the cover layer ascribed to a pocket of the packaging arrangement, in a direction of a common conductive track of the cover layer, which is connected to a common contact spot of the cover layer.

3. The device in accordance with claim 2, wherein the individual conductive tracks, the common conductive track, the individual contact spots and the common contact spot of the cover layer are arranged on the side facing the carrier layer.

4. The device in accordance with claim 3, wherein a side of the carrier plate facing the cover layer includes individual contact spots, which are ascribed to the individual contact spots of the cover layer and are electrically connected in the composite layering with said individual contact spots, said carrier plate having a common contact spot, which is ascribed to the common contact spot of the cover layer and is electrically connected in the composite layering with said common contact spot, and each individual contact spot of the carrier plate being connected to an individual terminal contact point of the carrier plate via an individual conductive track of the carrier plate, the common contact spot of the carrier plate being connected via a common conductive track of the carrier plate to a common terminal contact point of the carrier plate, such that an electrical connection to the electronic unit can be established via individual terminal contact points of the carrier plate and via the common terminal contact point of the carrier plate, when the composite layering bound to the packaging arrangement is inserted into a receiving part of a holding device.

5. The device in accordance with claim 4, wherein the individual terminal contact points of the carrier plate and the common terminal contact point of the carrier plate are arranged at one front end of the carrier plate.

6. The device in accordance with claim 5, wherein seen from the insertion pack, the common terminal contact point of the carrier plate is dimensioned shorter than the individual terminal contact points of the carrier plate and the individual terminal contact points of the carrier plate and the common terminal contact point of the carrier plate are arranged in a row, so that in the receiving part, the establishment of contact with the common terminal contact point during the insertion of the carrier plate into the receiving part occurs later than the establishment of contact to the individual terminal contact points of the carrier plate.

7. The device in accordance with claim 1, wherein the carrier plate includes a plastic material.

8. The device in accordance with claim 1, wherein the carrier plate includes a flexible material.

9. The device in accordance with claim 1, wherein the carrier plate in correspondence with the packaging arrangement exhibits two rows of openings arranged next to one another, running in a longitudinal direction and has an additional opening centrally arranged on the one end of the rows of openings opposite one another.

10. The device in accordance with claim 9, wherein the carrier plate exhibits, on the side of the additional opening opposite the two rows of openings, an opening ascribed to a compartment of the packaging arrangement.

11. The device in accordance with claim 4, wherein the individual contact spots of the cover layer and the common contact spot of the cover layer as well as the corresponding individual contact spots of the carrier plate and/or the common contact spot of the carrier plate are respectively electrically connected to one another via an adhesive registration point.

12. The device in accordance with claim 1, wherein a side of the carrier plate opposite the cover layer has a composite layering that includes a safety layer with peel back zones, which cover the openings of the carrier plate and which can be pulled off from the safety layer as needed for the removal of a product.

13. The device in accordance with claim 12, wherein the safety layer includes a material similar to paper.

14. The device in accordance with claim 12, wherein the peel back zones are detachably affixed by pressure application of an adhesive bonding compound to the side of the carrier plate and detachably secured to the safety layer via punched-in lines.

15. The device in accordance with claim 4, wherein the composite layering exhibits, on one front end transverse to an insertion direction and asymmetrically arranged relative to the longitudinal center line of the composite layering, alignment slots or nose tabs, which catch into corresponding nose tabs or alignment slots of the receiving part when the composite layering is inserted into the receiving part, said individual terminal contact points of the carrier plate and the common terminal contact point of the carrier plate on the front end being arranged in such a manner that contact is established only when the nose tabs catch into the alignment slots.

16. The device in accordance with claim 4, wherein the composite layering exhibits, on side edges thereof running parallel to an insertion direction, slits into which corresponding projections of the receiving part or of the holding device are caught, when the composite layering has reached a proper position in the receiving part.

17. The device in accordance with claim 1, wherein the composite layering and the packaging arrangement are bonded by an adhesive layer.

18. The device in accordance with claim 1, wherein the packaging arrangement includes registration marks on the sealing foil, which are visible and detectable through corresponding windows arranged in the composite layering, when the composite layering assumes a proper mounting position relative to the packaging arrangement.

* * * * *